United States Patent [19]

Fowks

[11] 4,456,891
[45] Jun. 26, 1984

[54] RADIO FREQUENCY SOURCE CIRCUIT PRIMARILY FOR IGNITING THE LAMP OF A RUBIDIUM FREQUENCY STANDARD

[75] Inventor: William R. Fowks, Yorba Linda, Calif.

[73] Assignee: Rockwell International Corporation, El Segundo, Calif.

[21] Appl. No.: 284,416

[22] Filed: Jul. 20, 1981

[51] Int. Cl.³ .......................... H03L 1/02; H03L 5/02; H03L 7/26; H01S 1/00
[52] U.S. Cl. ...................................... 331/3; 331/94.1; 315/267; 315/344
[58] Field of Search ................... 331/3, 94.1, 109, 183, 331/186; 315/267, 344, 348, 358; 324/304, 305

[56] References Cited

U.S. PATENT DOCUMENTS

| 2,975,330 | 3/1961 | Bloom et al. | 315/248 X |
| 3,815,048 | 6/1974 | Hamlet | 331/109 |
| 3,873,884 | 3/1975 | Gabriel | 315/267 |
| 3,898,583 | 8/1975 | Shuey | 331/109 X |

FOREIGN PATENT DOCUMENTS 55-107340  8/1980  Japan ........................ 331/3

Primary Examiner—Siegfried H. Grimm
Assistant Examiner—W. R. Paxman
Attorney, Agent, or Firm—H. Fredrick Hamann; Richard A. Bachand

[57] ABSTRACT

An improved oscillator circuit primarily for use as an RF source circuit for igniting a light discharge in a rubidium lamp used in a rubidium vapor cell frequency standard. A number of novel features are disclosed including an adjustable power capability dependent on current sensed feedback providing power adjustment over at least a 5-to-1 ratio; lamp heater monitoring for high oscillator power operation during warm-up; and light intensity monitoring for feedback bypass and high oscillator power operation whenever inadequate light discharge is detected.

14 Claims, 3 Drawing Figures

RADIO FREQUENCY SOURCE CIRCUIT PRIMARILY FOR IGNITING THE LAMP OF A RUBIDIUM FREQUENCY STANDARD

BACKGROUND OF THE INVENTION

1. Field of the Invention

The present invention relates to atomic stabilized frequency sources and more particularly, to an improved RF source circuit for igniting the discharge in a ribidium lamp of a rubidium frequency standard.

2. Prior Art

Although the present invention may find practical application in any one of numerous atomic stabilized frequency sources, it is particularly adaptable for operation in a rubidium vapor cell frequency standard. Rubidium vapor cell frequency standards, as well as other types of atomic stabilized frequency sources, are described extensively in the literature. For example, reference may be had to the texts respectively entitled, "Frequency and Time" by P. Kartaschoff, Academic Press, 1978; and "Frequency Synthesizers Theory and Design", Second Edition, by Vadim Manassewitsch, John Wiley & Sons, 1980. Such frequency sources are stabilized by quantum mechanical atomic state transition resonances such as the hyperfine atomic resonance frequency related to the change in the internal energy of the atom. A rubidium frequency standard operates as a discriminator based upon the energy absorption characteristics of rubidium-87. In practice, a rubidium lamp passes a lightbeam into a rubidium absorption cell. The rubidium cell absorbs some of the light energy because of the energy level transitions in the rubidium-87 gas. When an electromagnetic field frequency equal to the resonance frequency of the rubidium vapor is applied to the vapor cell, the number of energy level transitions in the rubidium-87 gas is increased and more of the light emitted by the rubidium lamp is absorbed by the rubidium vapor cell. Typically, a photodiode is used to detect the occurrence of the maximum absorption of light from the rubidium lamp which occurs when the frequency of the excitation electromagnetic field exactly matches the rubidium resonance frequency. Typically, a frequency synthesizer is used to generate the appropriate electromagnetic field frequency of approximately 6,834.685 MHz. This field frequency is modulated at a relatively slow rate (i.e., 154 Hz.) so that the photodiode provides a demodulated signal which may be applied to a phase detector or comparator which also receives a reference modulation signal. The output of the phase comparator is a DC error voltage which is used to control a voltage controlled crystal oscillator at a selected frequency, typically of 5 or 10 MHz. In this manner, the frequency of the crystal oscillator is stabilized to approximately one part in $10^{11}$ or better over long periods of time to provide a highly stable and accurate frequency source.

Typically, because of the chemical characteristics of the rubidium gas and the requirement for a stable and selected light intensity and spectrum, the rubidium lamp is heated to a selected operating temperature and is ignited by an electrodeless RF field excitation generated by means of a coil driven by an RF source. Unfortunately, the impedance of the lamp traverses extremes, equivalent to a pure capacitance prior to ignition and becoming a complex impedance changing with the level of the RF ignition signal and the lamp temperature. This impedance change occurs because the carrier gas used with the rubidium within the lamp container ignites at a lower potential than the rubidium. As the lamp heats up the rubidium vapor enters an ionized state eventually suppressing the carrier gas light output. In the prior art an RF oscillator is used which can withstand the impedance variation while delivering power to the lamp since a fixed matching circuit to match the changing impedance is impractical. The lamp then becomes part of the oscillator circuit by field coupling causing the frequency of the RF excitation field to change with the lamp impedance. Unfortunately, such RF oscillator frequency changes tend to destabilize the lamp light output producing instability in the frequency of the rubidium source. Furthermore, after the lamp has been ignited and stabilized, it is not uncommon for a momentary power interruption to cause the lamp to reignite in an undesirable mode or even worse, to fail to reignite at all. This, of course, has the effect of precluding proper operation of the rubidium frequency standard.

SUMMARY OF THE INVENTION

The present invention provides a lamp radio frequency source circuit which overcomes or substantially reduces the disadvantages of the prior art by providing means for avoiding the impedance variation and reignition problems indicated above. More specifically, the present invention provides an RF oscillator circuit for igniting a rubidium lamp in a rubidium frequency standard which is adjustable in power and regulated with a fixed DC voltage and which utilizes current sensed feedback to permit RF oscillator power variations to compensate for variations in impedance. Furthermore, in the present invention, when the rubidium standard is initially turned on, the lamp heater is monitored and the lamp RF power is forced to maximum until the proper heater temperature is reached. This heater/RF oscillator relationship reduces rubidium lamp warm-up time and assures proper lamp ignition. After the appropriate heater temperature is reached, the lamp RF power is automatically reduced to a preset value which may be determined by a manual setting of a potentiometer in the current sensed feedback circuit of the oscillator. In addition, the present invention utilizes a light sensing feedback circuit employing the photodiode of the rubidum frequency standard to apply a delayed level sensitive control to the RF oscillator to maintain proper lamp ignition and thus minimize the opportunity for lamp ignition failure or ignition in an undesirable mode, either of which would adversely affect the operation of the frequency standard.

OBJECTS

It is therefore a primary object of the present invention to provide a rubidium frequency standard which incorporates an improved lamp radio frequency source circuit that overcomes and/or substantially reduces the aforementioned disadvantages of the prior art.

It is another object of the present invention to provide an improved RF source circuit for the lamp of a rubidium frequency standard which provides decreased sensitivity to changes in equivalent lamp impedance, and faster warm-up time to ensure proper lamp ignition.

It is still an additional object of the present invention to provide an improved lamp radio frequency source circuit for a rubidium frequency standard, which circuit employs variable current sensed feedback to permit adjustment of the RF oscillator power output to compensate for variations in equivalent lamp impedance.

It is still a further object of the present invention to provide an improved radio frequency source circuit for a lamp of a rubidium frequency standard which employs lamp heater monitoring to initially increase the power of the RF oscillator output to decrease lamp warm-up time while ensuring proper lamp ignition.

It is still a further object of the present invention to provide an improved radio frequency source circuit for a lamp of a rubidium frequency standard which employs feedback derived from the photodiode of the rubidium frequency standard to control the magnitude of the RF output in the oscillator and thus assure proper lamp ignition.

BRIEF DESCRIPTION OF THE DRAWINGS

The aforementioned objects and advantages of the present invention, as well as additional objects and advantages thereof, will be more fully understood hereinafter as a result of the detailed description of the presently preferred embodiment of the invention when taken in conjunction with the accompany drawings in which.

DETAILED DESCRIPTION OF A PREFERRED EMBODIMENT

Figure 1:
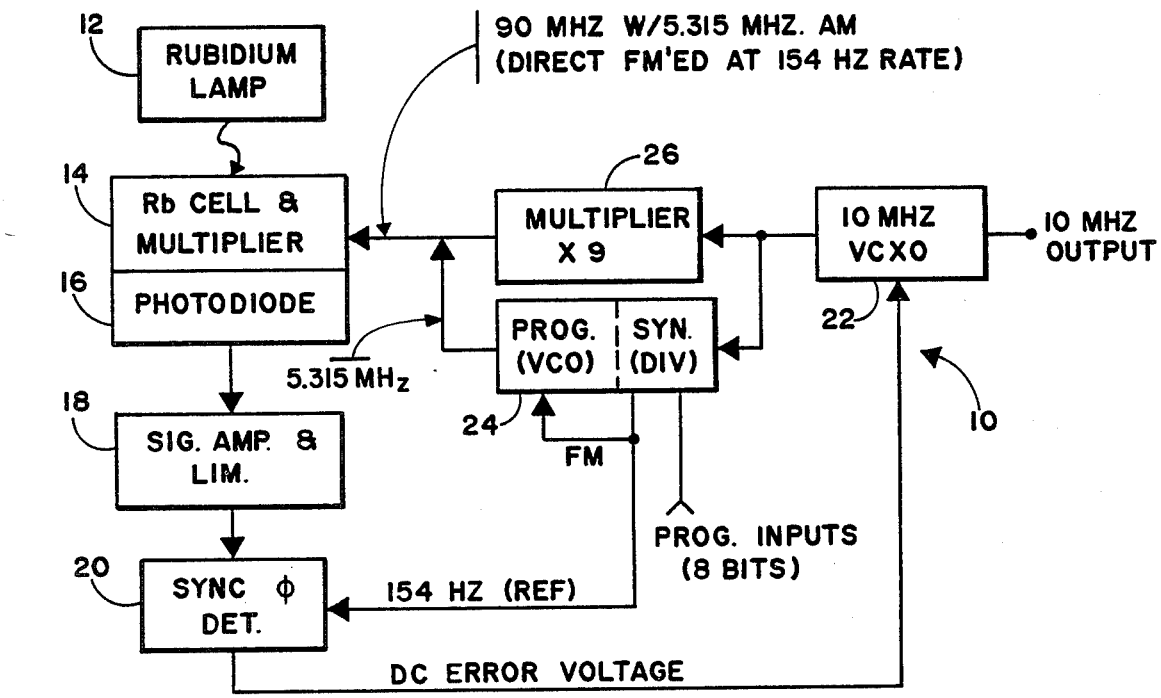
FIG. 1 is a simplified block diagram of a rubidium frequency standard in which the improved lamp radio frequency source circuit of the present invention may be utilized.

Referring to FIG. 1 there is shown a simplified block diagram of a rubidium frequency standard 10 employing an improved lamp radio frequency source circuit in accordance with the present invention. More specifically, and as is well-known in the art, the rubidium frequency standard 10 utilizes a rubidium lamp 12 to generate a beam of light. The lightbeam is directed through a rubidium vapor cell and multiplier 14 and is incident upon a photodiode 16. The output of the photodiode is connected to a signal amplifier and limiter 18 which is, in turn, connected to a synchronous phase detector 20. Synchronous phase detector 20 develops a DC error voltage which is applied to a 10 MHz. voltage controlled crystal oscillator 22 to adjust the precise frequency thereof. Crystal oscillator 22 provides a nominal 10 MHz. output signal which is the externally accessible output of the rubidium frequency source 10. Crystal oscillator 22 also provides output signals to a programmable frequency synthesizer 24 and to a ×9 frequency multiplier 26.

Synthesizer 24 generates a phase locked 154 Hz. periodic signal that is applied as a reference signal to synchronous phase detector 20 and which is also applied as a frequency modulating signal to a phase locked voltage controlled oscillator internal to the synthesizer. The output of this internal voltage controlled oscillator is a periodic signal of approximately 5.315 MHz. which is summed up with the 90 MHz. output signal of multiplier 26. That combination of signals is applied to rubidium cell and multiplier 14. The lower sideband of the 76th harmonic of the 90 MHz. signal output of multiplier 26 (amplitude modulated by the 5.315 MHz. output of the synthesizer), generated by the non-linear characteristics of a snap diode multiplier 14, corresponds to the approximate resonance frequency of the hyperfine atomic state transition of the rubidium cell.

As is well-known in the art to which the present invention pertains, when the frequency of the applied electromagnetic field matches the resonance frequency of the rubidium cell, the maximum number of energy transitions occur and the maximum absorption of rubidium-87 light is produced in the rubidium cell. Accordingly, the effect of the 154 Hz. frequency modulation of the lower sideband of the 90 MHz. output of multiplier 26 amplitude modulated by the 5.315 MHz. output of the synthesizer 24, is a photodiode output signal which is composed of a combination of a 154 Hz. fundamental frequency and a second harmonic at a frequency of 308 Hz. When the resonance frequency of the rubidium cell is matched precisely by the frequency of the applied electromagnetic radiation, the fundamental modulation frequency of 154 Hz. is, in effect, zeroed out and only the 308 Hz. second harmonic remains. On the other hand, if precise matching of the frequency of the electromagnetic radiation and the resonance of the cell is not achieved, the fundamental modulation frequency at 154 Hz. is produced by the photodiode with a phase dependent upon whether the frequency of the applied electromagnetic radiation is above or below the resonance frequency of the cell. The photodiode output signal is applied to the signal amplifier and limiter 18 and thereafter to synchronous phase detector 20. Detector 20 compares the photodiode output signal with a 154 Hz. reference signal derived from frequency synthesizer 24. The detector thus provide a DC error voltage the magnitude of which may be used to accurately track the frequency of the 10 MHz. voltage controlled crystal oscillator 22 to the resonance frequency of the rubidium cell.

As further indicated in FIG. 1, programmable frequency synthesizer 24 includes provision for programmable inputs comprising 8 bits of binary code for controlling the frequency thereof. Furthermore, the synthesizer provides the 154 Hz. reference signal to synchronous phase detector 20 to develop the DC error signal applied to the crystal oscillator 22. It also provides means for directly frequency modulating an internal VCO for developing the frequency modulated 5.315 MHz. signal that is summed with the output of multiplier 26 and is eventually used to derive the precise electromagnetic field frequency applied to the rubidium cell and multiplier 14.

Figure 2:
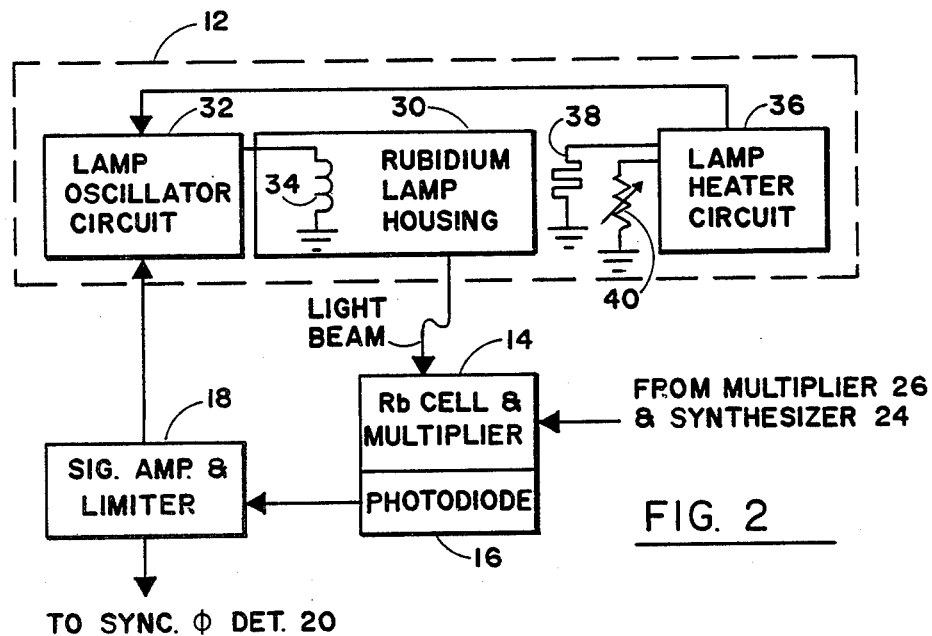
FIG. 2 is a simplified block diagram of the rubidium lamp of the present invention including the novel lamp oscillator circuit thereof and its interconnections both within the lamp and with other circuits in the rubidium frequency standard.

The electrical configuration of rubidium lamp 21 as well as its interconnection with other portions of the rubidium frequency standard 10 are shown in somewhat more detail in the block diagram of FIG. 2. More specifically, it is shown in FIG. 2 that rubidium lamp 12 actually comprises a rubidium lamp housing 30, a lamp oscillator circuit 32 which supplies power to a radio frequency igniting coil 34 which is contained within lamp housing 30, and a lamp heater circuit 36 which provides heating power to heater 38 the temperature of which is monitored by a thermistor 40. As also indicated, rubidium lamp housing 30 produces a lightbeam which is incident upon rubidium cell and multiplier 14 and photodiode 16. Photodiode 16, as indicated previously in conjunction with FIG. 1, provides a signal input to signal amplifier and limiter 18 which is, in turn, used to provide the signal to synchronous phase detector 20. However, signal amplifier and limiter 18 also provides a feedback signal to the lamp oscillator circuit 32 the purpose of which will be more fully understood hereinafter as a result of the discussion of FIG. 3. An additional feedback loop exists between lamp heater circuit 36 and lamp oscillator circuit 32 the purpose of which will also be described hereinafter in conjunction with FIG. 3 to which the discussion shall now be addressed.

Figure 3:
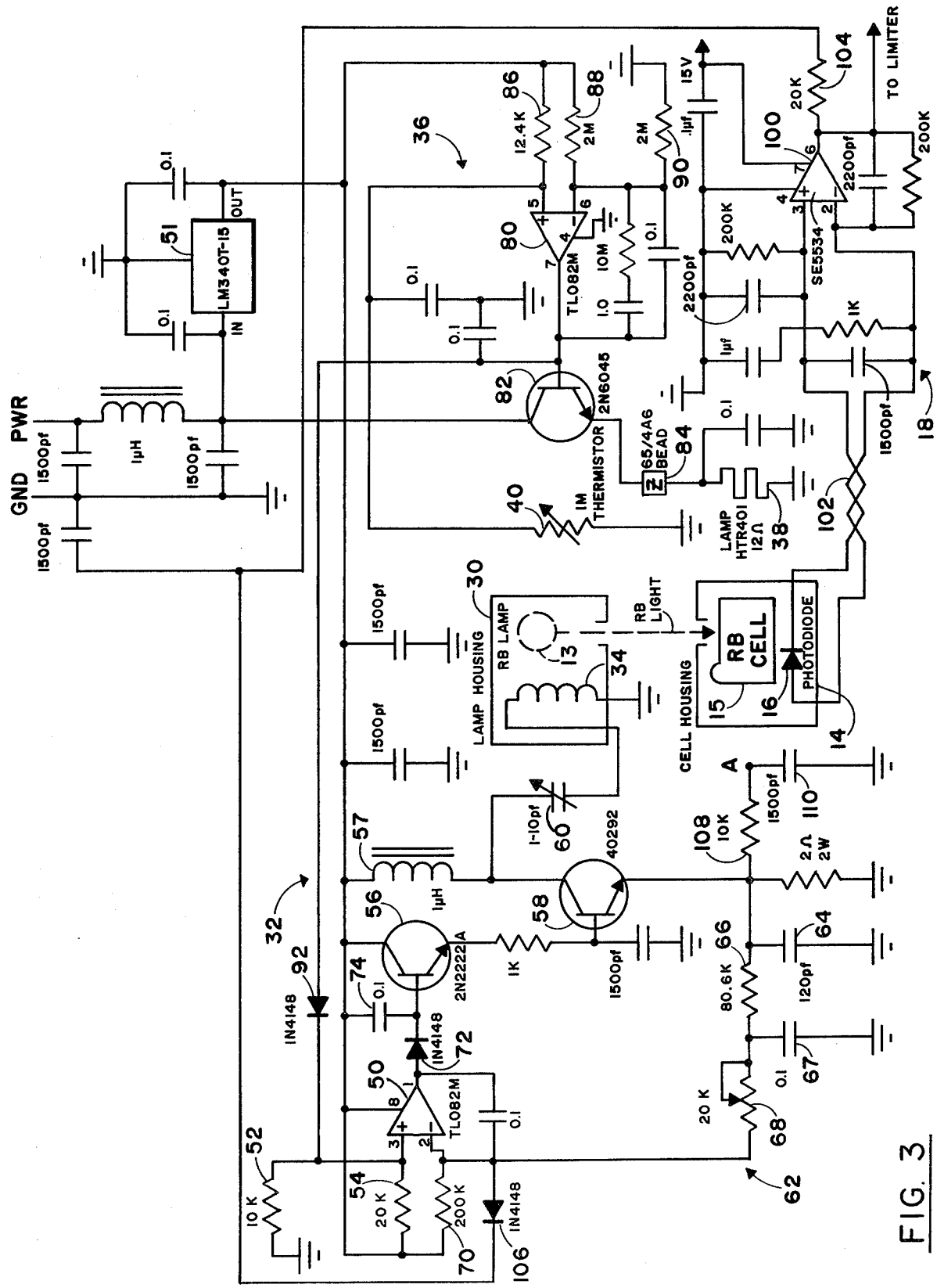
FIG. 3 is a detailed schematic diagram of the novel lamp circuit of the present invention including the interconnections thereof with other circuits within the rubidium frequency standard.

Referring to FIG. 3, which is a schematic diagram corresponding to the block diagram of FIG. 2, it will be seen that rubidium lamp housing 30, which includes a rubidium lamp 13 and an RF field coil 34, produces rubidium light which exits the lamp housing and enters the cell housing of rubidium cell and multiplier 14 including rubidium cell 15 and photodiode 16. RF field coil 34 is driven by an RF lamp oscillator circuit 32 and rubidium lamp 13 is heated by a lamp heater blanket 38 and heater transistor 82 driven by a lamp heater circuit 36 including thermistor temperature monitor 40.

Lamp oscillator circuit 32 comprises a comparator amplifier 50 the positive input terminal of which is connected to a source of fixed voltage (5 volts) by means of a voltage divider formed by resistors 52 and 54, one end of which is connected to the output of 15 volt voltage regulator 51. The negative terminal of comparator amplifier 50 is connected to a lamp oscillator feedback circuit 62 which will be more fully described hereinafter. The output of comparator amplifier 50 drives the base terminal of a driver/buffer transistor 56, the emitter terminal of which is connected to the base of the oscillator transistor 58. The collector terminal of oscillator transistor 58 is connected to lamp oscillator field coil 34 through a series variable capacitor 60 the adjustment of which determines the oscillator frequency. Nominally, the oscillator frequency is set at 105 MHz in the preferred embodiment. RF choke 57, connected to the collector circuit of transistor 58, isolates the RF oscillations from the 15 volt regulated output line of regulator 51.

The emitter circuit of transistor 58 is connected to the DC feedback network 62 which comprises resistor 66, capacitor 67 and potentiometer 68, the latter of which is connected to the negative terminal of comparator amplifier 50. The level of the RF positive feedback signal is initially determined by the 120 picofarad capacitor 64 in ratio to the collector-to-emitter junction capacitance of transistor 58 which is nominally 25 picofarads. The DC feedback loop voltage is then made adjustable by means of the potentiometer 68 in series with resistor 66 the total resistance of which is in a divider ratio relationship with 200K resistor 70 at the negative terminal of comparator amplifier 50. Capacitor 67 acts as an RF short to ground to provide a substantially DC current to the negative terminal of the comparator.

A diode 72 and capacitor 74 are connected between the output of comparator amplifier 50 and the base terminal of transistor 56 to assure initiation of oscillations within oscillator circuit 32 during startup. More specifically, at lamp ignition startup, diode 72 blocks the output of comparator amplifier 50 while capacitor 74, in effect, shorts the collector to base of transistor 56. However, once startup is achieved the output of comparator amplifier 50 forward biases diode 72 permitting feedback circuit 62 and comparator amplifier 50 to attain their nominal levels in operation of oscillator 32. In this mode, comparator amplifier 50 provides a high gain DC loop gain of approximately 100,000, amplifying the voltage differential between its negative input terminal, obtained from feedback circuit 62, and its positive input terminal, obtained from the voltage divider of resistors 52 and 54.

Lamp heater circuit 36 comprises a similar high gain DC open loop configured comparator amplifier 80 which drives the base terminal of a transistor 82. The emitter terminal of transistor 82 is conncted to a lamp heater 38 through a ferrite bead 84 which prevents the heater circuit 36 from oscillating by presenting a bulk inductive reactance as is well-known in the art. The positive input terminal to comparator amplifier 80 is connected to thermistor 40 the resistance of which is nominally 12.4K at the lamp operating temperature of 137 degrees C. In addition, a fixed resistor 86, at 12.4K, is also connected to the positive input terminal. A pair of 2 megohm resistors 88 and 90 are connected to the negative input terminal of comparator amplifier 80. Thermistor 40 and resistors 86, 88 and 90 form a bridge circuit of which resistors 88 and 90 form the reference arms whereby variations in the resistance of thermistor 40 unbalance the bridge. A bridge unbalance results in a change in the output signal level of comparator amplifier 80 which, in turn, drives transistor 82 and heater 38.

The output of comparator amplifier 80 is connected in a feedback arrangement to lamp oscillator circuit 32 through a diode 92. As a result, during approximately the first 90 seconds of lamp heater initiation, diode 92 is forward biased and the resultant feedback to the positive terminal of comparator amplifier 50 overrides feedback loop 62. During this period maximum oscillator output power (i.e., 6 watts) is delivered to RF coil 34 until the proper lamp operating temperature is achieved. This feedback configuration reduces the warm-up time and ensures proper lamp ignition until proper heating occurs. When the appropriate lamp operating temperature is achieved, the feedback voltage through diode 92 is reduced, the diode becomes reversed biased and the feedback loop 62 of the oscillator 32 assumes control of the RF power in the oscillator.

A similar loop-overriding feedback arrangement is connected between photodiode 16 and the lamp oscillator circuit 32. More specifically, as shown in FIG. 3, photodiode 16 is connected to the signal amplifier portion of signal amplifier and limiter 18 (see FIG. 1). The signal amplifier comprises an extremely low noise operational amplifier 100 to which the photodiode output is connected through a twisted pair 102 to further minimize noise interference. Photodiode 16 operates in the photoconductive mode and accordingly, the feedback circuit of low noise operational amplifier 100 is adapted to null out the photovoltaic effects of photodiode 16 which might otherwise adversely effect the accurate operation of the frequency standard. Amplifier 100, in combination with series output resistor 104, produces a DC voltage output which is approximately 400,000 times the photoconductive current produced by photodiode 16. Thus, for example, when the current produced by photodiode 16 in response to the rubidium light beam generated by rubidium lamp 13 is 20 microamps, the voltage output through resistor 104 is equal to approximately 8 volts.

The output signal of low noise operational amplifier 100, derived through series resistor 104, is applied to diode 106 in the lamp oscillator circuit 32. If the output of photodiode 16 is low, indicating ignition in an improper mode or lack of ignition, diode 106 is forward biased thereby imbalancing comparator amplifier 50 and forcing amplifier 50 to produce maximum RF oscillator power which is delivered to field coil 34 in lamp housing 30. However, as soon as the proper photodiode current is attained, which is indicative of a proper light level delivered to the rubidium cell 15, the output signal of amplifier 100 reaches a sufficient voltage level to reverse bias diode 106 in circuit 32 and allowing control of the RF power to again reside in feedback network 62.

Thus it is seen that lamp oscillator circuit 32 utilizes a current sensed feedback arrangement which normally controls the output signal level of the RF oscillator into the field coil 34. Typically, a feedback circuit adjustment procedure produces a balance between the 5 volt reference level applied to the positive terminal of comparator amplifier 50 and the DC value of the current feedback through variable resistor 68 applied to the negative terminal of comparator amplifier 50. Normally, potentiometer 68 is adjusted while the voltage at point A, at the interconnection of a 10K resistor 108 and a 1500 picofarad capacitor 110, is monitored. Resistor 108 and capacitor 110 provide an RF filter from the emitter of transistor 58 to generate a clean DC level of approximately 2 MV/MA as an indication of the feedback potential to properly adjust potentiometer 68 and provide the aforementioned balance in feedback circuit 62. It has also been shown that comparator amplifier 50 is blocked initially to assure proper ignition of rubidium lamp 13 prior to a steady state condition in amplifier 50 and feedback circuit 62. Furthermore, it has been shown that the lamp oscillator circuit of the present invention employs two additional feedback loops. One such feedback loop is from heater circuit 36 which provides oscillator feedback loop bypass and maximum RF oscillator power during a period of approximately 90 seconds while the operating temperature of the rubidium lamp reaches steady state. Another such feedback loop is from the photodiode and signal amplifier circuit 16 and 18 respectively, and also provides feedback loop bypass whenever the light level detected by the photodiode decreases below a nominal level indicating improper ignition whereby RF oscillator circuit 32 forces maximum power into the field coil 34 to assure resumption of proper lamp ignition.

It will now be understood that what has been disclosed herein is a novel lamp RF oscillator source circuit for a rubidium frequency standard that utilizes a rubidium lamp to optically pump a rubidium vapor cell. The oscillator source circuit of the present invention utilizes a number of highly advantageous and novel features to provide proper lamp ignition irrespective of impedance changes and lamp ignition anomalies and also to provide reduced warm-up time during system activation. More specifically, the present invention provides an RF oscillator in which the power is adjustable and in which adjustable current sensed feedback is employed. The power in the oscillator can be adjusted over a ratio of 5 to 1 by means of a potentiometer to provide optimum lamp ignition operation during steady state conditions. Furthermore, the present circuit utilizes feedback from the lamp heater to force maximum RF power into the lamp discharge ignition field coil to reduce warm-up time and to ensure proper lamp ignition during the temperature increase of the heater until proper lamp operating temperature is attained. The RF power then falls to the preset value determined by the current sensed feedback adjustment. Another novel and highly advantageous feature of the present invention disclosed herein relates to an additional feedback loop including the rubidium cell photodiode. This additional feedback loop produces maximum RF oscillator power whenever the rubidium lamp light level falls below that corresponding to proper ignition, by automatically overriding the feedback loop until proper ignition is attained.

It will also be understood by those having skill in the art to which the present invention pertains that although a particular preferred embodiment of the invention has been disclosed herein, numerous modifications and additions may be made hereto without deviating from the scope of the invention. For example, although specific components, circuit configurations and voltage and current levels used to achieve the aforementioned advantageous features of the invention have been disclosed, it will be understood that one may make modifications to the circuit by substituting components of different values, different circuit configurations and by utilizing different voltage and current levels. However, such modifications are contemplated as being within the scope of the present invention, which is limited only by the appended claims.

I claim:

1. An atomic frequency standard of the type used for stabilizing a frequency source by tracking it to a hyperfine transition resonance of an atomic frequency resonator having a source of light for optically pumping a resonance cell and a photodiode for detecting resonance and having a light source control circuit comprising:

a field coil in proximity to said source of light,
means for generating a periodic signal through said coil for igniting a slight discharge in said source of light,
means for generating a direct current signal indicative of the power level of said periodic signal,
means for controlling said power level,
a feedback circuit connecting said direct current signal generating means and said power level controlling means, including comparator means for comparing said direct current signal with a reference signal and for generating a comparison signal controlling said power level controlling means,
a heater circuit for raising the light source temperature to a selected optimum level for proper operation of said atomic frequency resonator,
a sensor for detecting said temperature, and
means connected between said heater circuit and said comparator means for increasing said reference signal during the heater warm-up period whereby said power level is increased during said period.

2. The atomic frequency standard as recited in claim 1 wherein said feedback circuit further comprises means for adjusting the level of said direct current signal for controlling said power level.

3. The atomic frequency standard recited in claim 2 wherein said power level controlling means permits the adjustment of said power level over a power ratio of at least 5 to 1.

4. The atomic frequency standard recited in claims 1, 2, or 3 wherein said periodic signal is frequency variable over a range including 105 MHz.

5. The atomic frequency standard recited in claims 1, 2 or 3 wherein said atomic frequency standard is of the rubidium vapor cell type and wherein said light source is a rubidium lamp.

6. A rubidium vapor cell frequency standard of the type used for stabilizing a frequency source by tracking it to a hyperfine resonance of a rubidium vapor cell resonator optically pumped by a rubidium lightbeam generated by a rubidium lamp, having a photodiode for detecting resonance and having a lamp control circuit for igniting a rubidium light discharge in said lamp, the control circuit comprising:

a field coil in proximity to said lamp, an oscillator connected to supply a periodic signal to said coil, means for generating a direct current signal indicative of the power level of said periodic signal, and also including input means for controlling said power level, a first feedback circuit connecting said direct current signal generating means and said input means, said first feedback circuit including a comparator for comparing said direct current signal with a reference signal and for generating a comparison signal applied to said input means, a heater circuit for raising the lamp temperature to a selected optimum level for proper operation of said rubidium frequency resonator, a sensor for detecting said lamp temperature, a second feedback circuit connected between said heater circuit and said comparator for increasing said reference signal during the heater warm-up period whereby said power level is increased during said warm-up period, and means connected to said comparator for bypassing said first feedback circuit and increasing said power level whenever said light discharge falls below a selected minimum intensity level.

7. The frequency standard recited in claim 6 wherein said first feedback circuit further comprises means for adjusting the level of said direct current signal for controlling said power level.

8. The frequency standard recited in claim 7 wherein said adjusting means permits the adjustment of said power level over a power ratio of at least 5 to 1.

9. The frequency standard recited in claims 6, 7, or 8, wherein said periodic signal is frequency variable over a range including 105 MHz.

10. An atomic frequency standard of the type used for stabilizing a frequency source by tracking it to a hyperfine transition resonance of an atomic frequency resonator having a source of light for optically pumping a resonance cell and a photodiode for detecting resonance and having a light source control circuit comprising:

a field coil in proximity to said source of light, means for generating a periodic signal through said coil for igniting a light discharge in said source of light, means for generating a direct current signal indicative of the power level of said periodic signal, means for controlling said power level, a feedback circuit connecting said direct current signal generating means and said power level controlling means, said feedback circuit including comparator means for comparing said direct current signal with a reference signal and for generating a comparison signal applied to said power level controlling means, means connected between said photodiode and said comparator means, for bypassing said feedback circuit and increasing said power level whenever said light discharge falls below a selected minimum intensity level.

11. The atomic frequency standard as recited in claim 10 wherein said feedback circuit further comprises means for adjusting the level of said direct current signal for controlling said power level.

12. The atomic frequency standard recited in claim 11 wherein said adjusting means permits the adjustment of said power level over a power ratio of at least 5 to 1.

13. The atomic frequency standard recited in claims 10, 11, or 12 wherein said periodic signal is frequency variable over a range including 105 MHz.

14. The atomic frequency standard recited in claim 13 wherein said atomic frequency standard is of the rubidium vapor cell type and wherein said light source is a rubidium lamp.

* * * * *